US010925149B2

(12) United States Patent
Ueda (10) Patent No.: US 10,925,149 B2
(45) Date of Patent: Feb. 16, 2021

(54) HIGH FREQUENCY MODULE, BOARD EQUIPPED WITH ANTENNA, AND HIGH FREQUENCY CIRCUIT BOARD

(71) Applicant: Murata Manufacturing Co., Ltd., Kyoto (JP)

(72) Inventor: Hideki Ueda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 325 days.

(21) Appl. No.: 15/705,927

(22) Filed: Sep. 15, 2017

(65) Prior Publication Data
US 2018/0084637 A1  Mar. 22, 2018

(30) Foreign Application Priority Data
Sep. 16, 2016  (JP) .............................. JP2016-181093

(51) Int. Cl.
*H05K 1/02* (2006.01)
*H01Q 21/06* (2006.01)
(Continued)

(52) U.S. Cl.
CPC .......... *H05K 1/0218* (2013.01); *H01L 23/66* (2013.01); *H01P 3/08* (2013.01); *H01Q 1/12* (2013.01);
(Continued)

(58) Field of Classification Search
CPC .... H05K 1/0239; H05K 1/0218; H05K 1/111; H05K 1/0219; H01L 23/66; H01L 24/16;
(Continued)

(56) References Cited

U.S. PATENT DOCUMENTS 5,629,838 A * 5/1997 Knight ............... G01R 31/3025
                                                     361/782
7,405,477 B1 * 7/2008 Tao .................... H01L 23/49838
                                                     257/659
(Continued)

FOREIGN PATENT DOCUMENTS

JP   2004-015160 A   1/2004
JP   2004-273509 A   9/2004
(Continued)

OTHER PUBLICATIONS

Japanese Notice of Reasons for Rejection for Japanese Application No. 2016-181093 dated Dec. 25, 2018.

*Primary Examiner* — Hoa C Nguyen
(74) *Attorney, Agent, or Firm* — Pearne & Gordon LLP (57) ABSTRACT

A first board includes a first ground plane, a first ground land, a first transmission line, and a first signal land connected to the first transmission line, wherein the first ground land and the first signal land are formed on the same surface. A second board includes a second ground plane, a second ground land, a second transmission line, and a second signal land connected to the second transmission line, wherein the second ground land and the second signal land are formed on a surface opposing the first board. The second ground land and the second signal land oppose the first ground land and the first signal land, respectively. A conduction member connects the first ground land and the second ground land. The first signal land and the second signal land are connected by capacitance coupling without using any conductor.

8 Claims, 6 Drawing Sheets

(51) Int. Cl.
*H01Q 1/22* (2006.01)
*H01Q 1/38* (2006.01)
*H01L 23/66* (2006.01)
*H01P 3/08* (2006.01)
*H01Q 1/12* (2006.01)
*H01Q 1/48* (2006.01)
*H05K 1/11* (2006.01)
*H05K 3/34* (2006.01)
*H01L 23/552* (2006.01)
*H01L 23/60* (2006.01)
*H01L 23/00* (2006.01)

(52) U.S. Cl.
CPC ............ *H01Q 1/2283* (2013.01); *H01Q 1/38* (2013.01); *H01Q 1/48* (2013.01); *H01Q 21/06* (2013.01); *H05K 1/0219* (2013.01); *H05K 1/0222* (2013.01); *H05K 1/0239* (2013.01); *H05K 1/11* (2013.01); *H01L 23/552* (2013.01); *H01L 23/60* (2013.01); *H01L 24/16* (2013.01); *H01L 2223/6627* (2013.01); *H01L 2223/6655* (2013.01); *H01L 2223/6677* (2013.01); *H01L 2223/6683* (2013.01); *H01L 2224/16225* (2013.01); *H01L 2224/16227* (2013.01); *H01L 2924/1421* (2013.01); *H01L 2924/15311* (2013.01); *H01L 2924/19031* (2013.01); *H01L 2924/19105* (2013.01); *H01L 2924/3025* (2013.01); *H05K 3/3436* (2013.01); *H05K 2201/10734* (2013.01); *H05K 2203/041* (2013.01)

(58) Field of Classification Search
CPC .......... H01Q 1/12; H01Q 1/2283; H01Q 1/38; H01Q 1/48
See application file for complete search history.

(56) References Cited

U.S. PATENT DOCUMENTS

| | | | |
|---|---|---|---|
| 2001/0039075 A1* | 11/2001 | Doyle | H01L 23/48 438/107 |
| 2003/0100200 A1 | 5/2003 | Franzon et al. | |
| 2004/0018654 A1* | 1/2004 | Drost | G06F 17/5077 438/17 |
| 2005/0077546 A1* | 4/2005 | Neaves | H01L 23/48 257/210 |
| 2008/0290475 A1 | 11/2008 | Sasaki | |
| 2009/0072389 A1 | 3/2009 | Neaves | |
| 2009/0095201 A1* | 4/2009 | Heitzmann | C09B 67/0002 106/31.85 |
| 2011/0011939 A1* | 1/2011 | Seah | G06K 19/07749 235/492 |
| 2014/0284386 A1* | 9/2014 | Finn | H01Q 1/2225 235/488 |
| 2016/0081190 A1 | 3/2016 | Inagaki et al. | |

FOREIGN PATENT DOCUMENTS

| | | |
|---|---|---|
| JP | 2007-027172 A | 2/2007 |
| JP | 2008-004714 A | 1/2008 |
| JP | 2008-205975 A | 9/2008 |
| JP | 2011-009505 A | 1/2011 |
| JP | 2011-135112 A | 7/2011 |
| JP | 2011-233609 A | 11/2011 |
| JP | 2016-058673 A | 4/2016 |

\* cited by examiner

HIGH FREQUENCY MODULE, BOARD EQUIPPED WITH ANTENNA, AND HIGH FREQUENCY CIRCUIT BOARD

This application claims priority from Japanese Patent Application No. 2016-181093 filed on Sep. 16, 2016. The content of this application is incorporated herein by reference in its entirety.

BACKGROUND OF THE DISCLOSURE

1. Field of the Disclosure

The present disclosure relates to high frequency modules, boards equipped with an antenna, and high frequency circuit boards.

2. Description of the Related Art

A connection structure in which lands of two high frequency circuit components are connected to each other with solder bumps or the like interposed therebetween is well-known.

Japanese Unexamined Patent Application Publication No. 2008-205975 discloses a device in which a high frequency semiconductor integrated circuit (RFIC) is mounted on a board with solder bumps interposed therebetween. A matching circuit is configured using parasitic capacitance that is formed between dummy bump pads of the RFIC and a ground layer of the RFIC. By performing wiring on the board side to interconnect the dummy bump pads, a capacitor with desired capacitance can be configured through combining the pieces of the parasitic capacitance in the dummy bump pad portions. Adjusting the capacitance of the capacitor makes it possible to obtain impedance matching.

Japanese Unexamined Patent Application Publication No. 2011-135112 discloses a connection structure in which a semiconductor integrated circuit that includes ground electrodes, power supply electrodes, and signal electrodes is mounted on a wiring board with bumps interposed therebetween. In an area where the signal electrodes are disposed sandwiching the ground electrode and the power supply electrode, the signal electrodes are connected to each other with a bump; in an area where the power supply electrode and the ground electrode are positioned adjacent to each other, the power supply electrodes are connected to each other with a bump, and the ground electrodes are also connected to each other with a bump; the power supply electrodes and ground electrodes other than those mentioned above are not connected. With the stated configuration, degradation in electric characteristics due to coupling capacitance between the adjacent bumps is prevented.

Japanese Unexamined Patent Application Publication No. 2004-15160 discloses a module equipped with an antenna that includes a slot antenna formed in one surface of a base body, a signal processing circuit which performs at least one of reception and transmission operations using the slot antenna, and a shield conductor for covering surfaces of the base body. A capacitor, an inductor, and the like are disposed inside the base body.

In the connection structure described in Japanese Unexamined Patent Application Publication No. 2008-205975, dummy bump pads need to be provided in the RFIC in advance so as to configure a capacitor for the impedance matching. With the connection structure described in Japanese Unexamined Patent Application Publication No. 2011-135112, although the degradation in electric characteristics due to coupling capacitance between the adjacent bumps is prevented, any measure to improve transmission characteristics between the semiconductor integrated circuit and the wiring board is not taken. The structure described in Japanese Unexamined Patent Application Publication No. 2004-15160 is a structure in which a capacitor and the like are provided inside the base body, and is different from a structure in which connections are carried out using solder bumps or the like.

BRIEF SUMMARY OF THE DISCLOSURE

An object of the present disclosure is to provide a high frequency module capable of suppressing the degradation in transmission characteristics between two high frequency components.

The high frequency module according to a first aspect of the present disclosure includes:

a first board which has a first ground plane, a first ground land connected to the first ground plane, a first transmission line, and a first signal land connected to the first transmission line, and in which the first ground land and the first signal land are formed on the same surface;

a second board which has a second ground plane, a second ground land connected to the second ground plane, a second transmission line, and a second signal land connected to the second transmission line, and in which the second ground land and the second signal land are formed on a surface opposing the first board and respectively oppose the first ground land and the first signal land; and a conduction member for connecting the first ground land and the second ground land, wherein the first signal land and the second signal land are connected by capacitance coupling without using any conductor.

A high frequency signal is transmitted between the first board and the second board through capacitance formed between the first signal land and the second signal land. Because the high frequency signal is transmitted to the first transmission line and the second transmission line without using a large-sized solder bump or the like, reflection of the high frequency signal due to discontinuity of characteristic impedance or the like is unlikely to be generated. This makes it possible to improve transmittance characteristics for the high frequency signal between the first board and the second board. In addition, because the first transmission line in the first board and the second transmission line in the second board are connected by capacitance coupling, a low frequency noise leakage in a direction from the first transmission line to the second transmission line or in the reverse direction can be suppressed.

The high frequency module according to a second aspect of the present disclosure is configured such that, in addition to the configuration of the high frequency module according to the first aspect:

the first board further includes a radiation element that is connected to the first signal land with the first transmission line interposed therebetween; and a high frequency circuit element is mounted on the second board and is connected to the second signal land with the second transmission line interposed therebetween.

Transmittance characteristics for the high frequency signal from the high frequency circuit element to the radiation element or from the radiation element to the high frequency circuit element can be improved. It can be suppressed that low frequency noise superposed on the second transmission line inside the second board on which the high frequency circuit element is mounted is transmitted to the radiation element.

The high frequency module according to a third aspect of the present disclosure is configured such that, in addition to the configuration according to the first or second aspect:

areas of the first signal land and the second signal land opposing each other are different from each other, and one of the above lands is encompassed in the other of the lands in a plan view.

In the case where one of the first and second signal lands is encompassed in the other thereof, even if a positional shift between the first board and the second board occurs, the capacitance of a capacitor configured by the first signal land and the second signal land is maintained to be constant. This makes it possible to suppress a variation in transmittance characteristics for the high frequency signal.

The high frequency module according to a fourth aspect of the present disclosure is configured such that, in addition to the configuration of the high frequency module according to the first through third aspects:

the first board includes a first stub provided on a connection portion between the first transmission line and the first signal land.

The high frequency module according to a fifth aspect of the present disclosure is configured such that, in addition to having the configuration of the high frequency module according to the first through fourth aspects:

the second board includes a second stub provided on a connection portion between the second transmission line and the second signal land.

Providing the first stub or the second stub makes it possible to obtain the impedance matching.

The high frequency module according to a sixth aspect of the present disclosure is configured such that, in addition to the configuration of the high frequency module according to the first through fifth aspects:

the first board includes a first protection film that is provided on a surface opposing the second board, exposes the first ground land, and covers the first signal land; and the second board includes a second protection film that is provided on a surface opposing the first board, exposes the second ground land, and covers the second signal land.

Because the first signal land is covered with the first protection film and the second signal land is covered with the second protection film, these lands can be protected before bonding the first board and the second board. Because the first signal land and the second signal land are not connected with a conductor interposed therebetween, the coupling between the first signal land and the second signal land is not obstructed by any of the first protection film and the second protection film.

The board equipped with an antenna according to a seventh aspect of the present disclosure includes:

a first dielectric substrate;

a radiation element provided on the first dielectric substrate;

a first signal land provided on the first dielectric substrate and connected to the radiation element;

a first ground plane provided in or on the first dielectric substrate;

a first ground land that is provided along with the first signal land on the same surface of the first dielectric substrate and is connected to the first ground plane; and a first protection film that is disposed on the surface of the first dielectric substrate where the first signal land is provided, covers the first signal land, and exposes the first ground land.

Because the first signal land is covered with the first protection film, the first signal land can be protected before bonding the first board to another board. The first signal land can be connected to a land of a corresponding board by capacitance coupling.

The high frequency circuit board according to an eighth aspect of the present disclosure includes:

a second dielectric substrate;

a high frequency circuit element mounted on the second dielectric substrate;

a second signal land provided on the second dielectric substrate and connected to the high frequency circuit element; a second ground plane provided in or on the second dielectric substrate;

a second ground land that is provided along with the second signal land on the same surface of the second dielectric substrate and is connected to the second ground plane; and a second protection film that is disposed on the surface of the second dielectric substrate where the second signal land is provided, covers the second signal land, and exposes the second ground land.

Because the second signal land is covered with the second protection film, the second signal land can be protected before bonding the second board to another board. The second signal land can be connected to a land of a corresponding board by capacitance coupling.

A high frequency signal is transmitted between the first board and the second board through capacitance formed between the first signal land and the second signal land. Because the high frequency signal is transmitted to the first transmission line and the second transmission line without using a large-sized solder bump or the like, reflection of the high frequency signal due to discontinuity of characteristic impedance or the like is unlikely to be generated. This makes it possible to improve the transmittance characteristics for the high frequency signal between the first board and the second board. In addition, because the first transmission line in the first board and the second transmission line in the second board are connected by capacitance coupling, a low frequency noise leakage in a direction from the first transmission line to the second transmission line or in the reverse direction can be suppressed.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

First Embodiment

A high frequency module 1 according to a first embodiment will be described with reference to FIG. 1. The high frequency module 1 according to the first embodiment includes a board equipped with an antenna 10 and a high frequency circuit board 30 mounted on the board equipped with an antenna 10.

Figure 1:
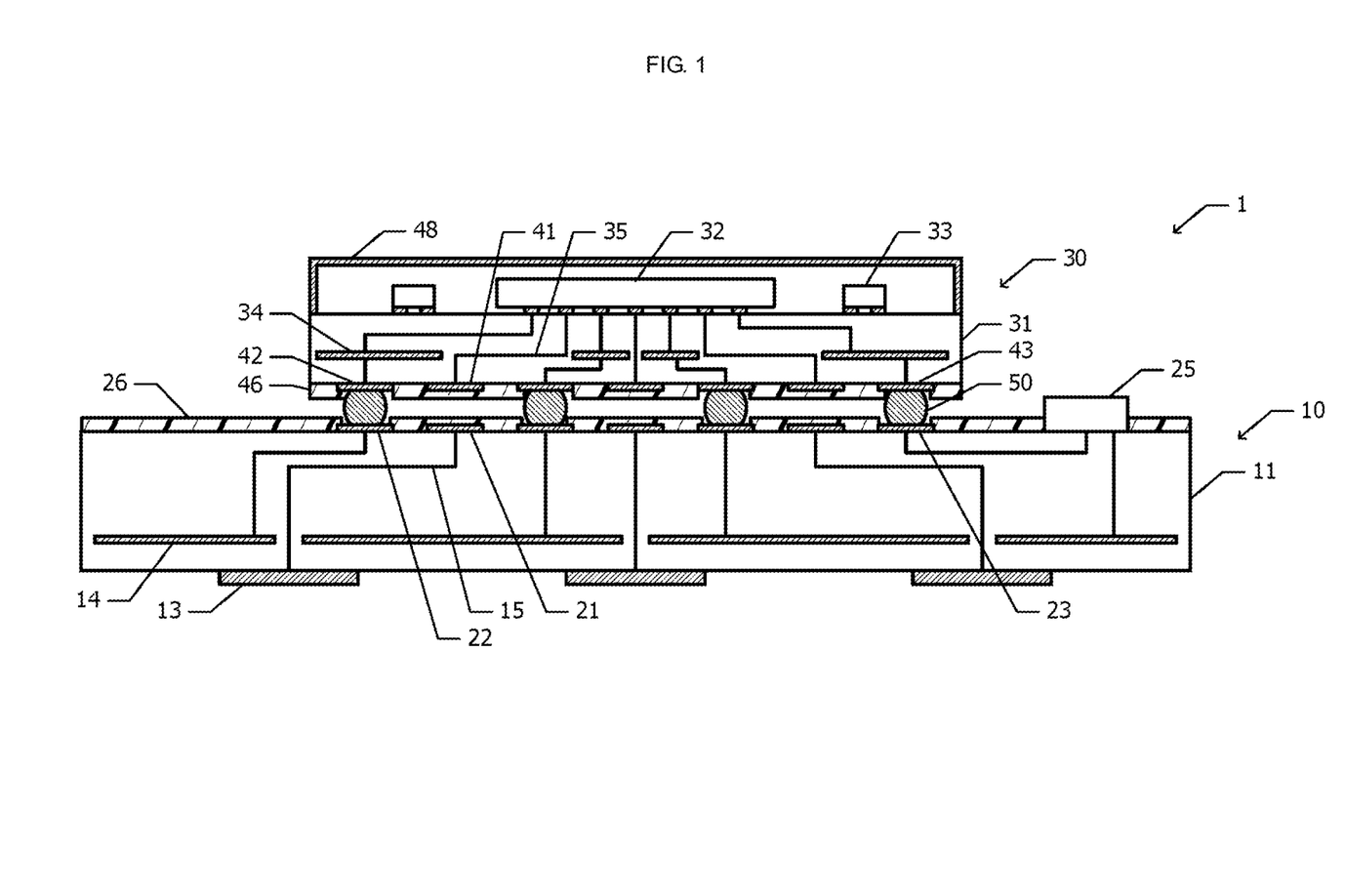
FIG. 1 is a cross-sectional view of a high frequency module according to a first embodiment.

FIG. 1 is a cross-sectional view of the high frequency module 1 according to the first embodiment. The board equipped with an antenna 10 includes a dielectric substrate 11. On one surface (hereinafter, referred to as an upper surface) of the dielectric substrate 11, there are provided a plurality of signal lands 21, a plurality of ground lands 22, a power supply land 23, and a connector 25. On the other surface (hereinafter, referred to as a lower surface) of the dielectric substrate 11, a plurality of radiation elements 13 are provided. An operation frequency band of the radiation element 13 is a millimeter wave band, for example. A ground plane 14 is disposed on a surface or at the inside of the dielectric substrate 11. The signal land 21 is provided corresponding to the radiation element 13, and a transmission line 15 provided inside the dielectric substrate 11 connects the signal land 21 and the radiation element 13 that correspond to each other. The ground plane 14 is connected to the ground land 22.

A coaxial cable serving as both a signal line and a power supply line is connected to the connector 25. A DC power supply, a local signal, an intermediate frequency signal, and the like are supplied to the board equipped with an antenna 10 through the coaxial cable. A shield conductor of the coaxial cable is connected to the ground plane 14 via the connector 25. The center conductor of the coaxial cable is connected to the power supply land 23 via the wiring inside the dielectric substrate 11.

The upper surface of the dielectric substrate 11 is covered with an insulative protection film 26 that is formed of solder resist or the like. The protection film 26 covers the signal land 21, but exposes the ground land 22 and the power supply land 23. For example, openings are provided in the protection film 26 at the positions corresponding to the ground land 22 and the power supply land 23.

The high frequency circuit board 30 includes a dielectric substrate 31. On one surface (hereinafter, referred to as a lower surface) of the dielectric substrate 31, there are provided a plurality of signal lands 41, a plurality of ground lands 42, and a power supply land 43. On the other surface (hereinafter, referred to as an upper surface) of the dielectric substrate 31, a high frequency integrated circuit element (RFIC) 32 and a high frequency component 33 are mounted. A ground plane 34 is disposed on a surface or at the inside of the dielectric substrate 31. The ground plane 34 is connected to the ground land 42 and is also connected to a ground terminal of the RFIC 32. Transmission lines 35 provided inside the dielectric substrate 31 respectively connect the plurality of signal lands 41 and a plurality of signal terminals of the RFIC 32.

The lower surface of the dielectric substrate 31 is covered with an insulative protection film 46 that is formed of solder resist or the like. The protection film 46 covers the signal lands 41, but exposes the ground lands 42 and the power supply land 43. For example, openings are provided in the protection film 46 at the positions corresponding to the ground lands 42 and the power supply land 43.

The high frequency circuit board 30 is mounted on the board equipped with an antenna 10 in a posture such that its lower surface opposes the board equipped with an antenna 10. The power supply land 23 of the board equipped with an antenna 10 and the power supply land 43 of the high frequency circuit board 30 are connected with a conduction member 50 such as a solder bump or the like, and the ground land 22 of the board equipped with an antenna 10 and the ground land 42 of the high frequency circuit board 30 are connected with the conduction member 50 such as a solder bump or the like.

The plurality of signal lands 21 of the board equipped with an antenna 10 oppose the plurality of signal lands 41 of the high frequency circuit board 30 so that the mutually corresponding signal lands 21 and 41 oppose each other while being distanced from each other, whereby the signal lands 21 and signal lands 41 are connected by capacitance coupling without using any conductor. The stated capacitance is determined by the size of the signal lands 21 and 41, an interval therebetween, and a dielectric constant of a space between the signal lands 21 and 41. An underfill material, for example, is filled into between the board equipped with an antenna 10 and the high frequency circuit board 30.

A shield 48 for covering the RFIC 32 and the high frequency component 33 is disposed on the upper surface of the dielectric substrate 31. For example, it is possible to seal the RFIC 32 as well as the high frequency component 33 with resin and form the shield 48 on a surface of the sealing resin. A shield cap made of metal may be used as the shield 48.

The signal terminals of the RFIC 32 are each connected to the radiation element 13 with the transmission line 35 inside the dielectric substrate 31, the capacitor generated between the signal lands 21 and 41, and the transmission line 15 inside the dielectric substrate 11 interposed therebetween.

Effect of First Embodiment

Next, an excellent effect of the high frequency module according to the first embodiment will be described.

In general, a thinned microstrip line with a thickness of about 50 μm is used as a transmission line of a millimeter wave band (wave length is no less than about 1 mm and no more than about 10 mm; frequency is no less than about 30 GHz and no more than about 300 GHz). In contrast, the signal lands 21 and 41, ground lands 22 and 42, and power supply lands 23 and 43 have a dimension of about several hundred μm. These lands are each formed in a substantially circular shape with a diameter of about 300 μm, for example. It is not preferable to make these lands further smaller from the standpoint of mechanical strength of bonding between the board equipped with an antenna 10 and the high frequency circuit board 30.

In a case of the signal lands 21 and 41 being connected to each other with a solder bump or the like, a difference between the width of the transmission line and the dimension of the land, solder bump, or the like cannot be ignored in the transmission of millimeter wave band. For example, a difference in dimension causes discontinuity in the characteristic impedance. The transmission characteristics are degraded due to the occurrence of reflection of the millimeter wave signal at a discontinuity point of the characteristic impedance.

In the first embodiment, the transmission line 15 inside the board equipped with an antenna 10 and the transmission line 35 inside the high frequency circuit board 30 are connected by capacitance coupling, whereby the degradation in the transmission characteristics due to a dimensional discontinuity of joint portions can be lessened.

Although the high frequency circuit board 30 is shielded by the shield 48, a power supply signal to drive the RFIC 32, DC noise, a local signal having a lower frequency than the millimeter wave band (in general, no less than about 1 GHz and no more than about 7.5 GHz), an intermediate frequency signal (in general, no less than about 10 GHz and no more than about 15 GHz), or the like are superposed on the transmission line 35 of the millimeter wave band. In a configuration in which the signal lands 21 and 41 are connected with a solder bump or the like, the abovementioned signals superposed on the transmission line 35 undesirably are leaked as noise to the board equipped with an antenna 10.

In the first embodiment, because the transmission line 35 inside the high frequency circuit board 30 and the transmission line inside the board equipped with an antenna 10 are connected by capacitance coupling, the leakage of low frequency noise from the high frequency circuit board 30 to the board equipped with an antenna 10 can be suppressed. This makes it possible to suppress the radiation of low frequency noise from the radiation element 13.

In a case of employing the configuration in which the signal lands 21 and 41 are connected with a solder bump or the like, the signal lands 21 and 41 need to be exposed. In the first embodiment, the signal lands 21 of the board equipped with an antenna 10 are covered with the protection film 26, and the signal lands 41 of the high frequency circuit board 30 are covered with the protection film 46. With this, the signal lands 21 and 41 can be also protected during a processing stage after having formed the protection films 26 and 46.

Variation on First Embodiment

Next, a variation on the first embodiment will be described. In the first embodiment, although the high frequency circuit board 30 is bonded to the board equipped with an antenna 10 using solder bumps or the like, other two high frequency circuit boards may be bonded. Also in this case, it is sufficient that a ground land and a power supply land of one board are respectively connected to a ground land and a power supply land of the other board with solder bumps or the like interposed therebetween, and signal lands of the respective boards are connected to each other by capacitance coupling without using any conductor.

Second Embodiment

Next, a high frequency module according to a second embodiment will be described with reference to FIG. 2A and FIG. 2B. Hereinafter, description of the same configurations as those of the high frequency module according to the first embodiment will be omitted.

Figure 2A:
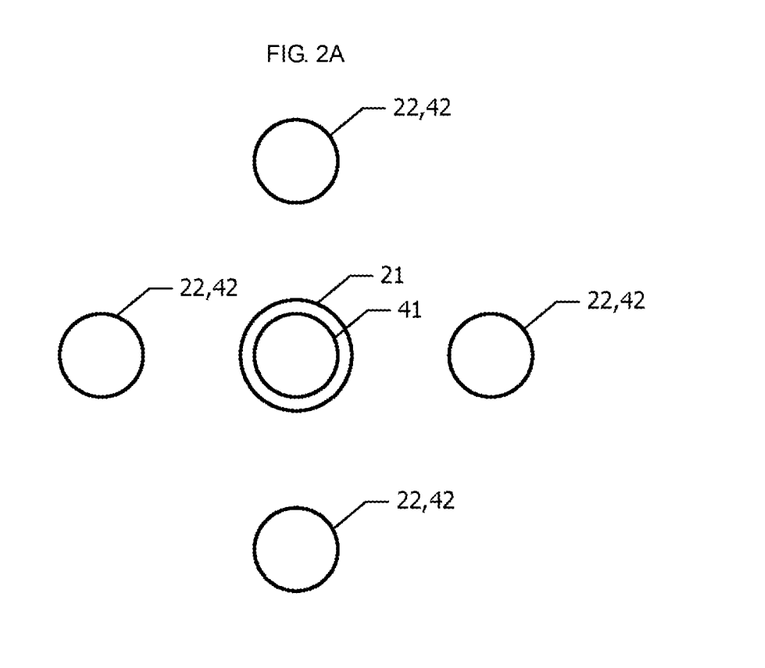
FIG. 2A and FIG. 2B are views each illustrating planar arrangement of parts of signal lands and ground lands of a board equipped with an antenna as well as parts of ground lands and signal lands of a high frequency circuit board according to a second embodiment.

FIG. 2A is a view illustrating planar arrangement of parts of the signal lands 21 and ground lands 22 of the board equipped with an antenna 10 (FIG. 1) as well as parts of the signal lands 41 and ground lands 42 of the high frequency circuit board 30. For example, four ground lands 22 are so disposed as to surround the signal land 21. The signal land 21 is larger in size than the ground land 22. For example, the signal land 21 is formed in a substantially circular shape with a diameter of about 400 µm, while the ground land 22 is formed in a substantially circular shape with a diameter of about 300 µm.

The signal lands 41 and ground lands 42 of the high frequency circuit board 30 (FIG. 1) are respectively disposed at the positions corresponding to the signal lands 21 and ground lands 22 of the board equipped with an antenna 10. The size and shape of the ground land 42 of the high frequency circuit board 30 are the same as those of the ground land 22 of the board equipped with an antenna 10. The signal land 41 of the high frequency circuit board 30 is smaller in size than the signal land 21 of the board equipped with an antenna 10. For example, the signal land 41 of the high frequency circuit board 30 is formed in a substantially circular shape with a diameter of about 300 µm. This causes the signal land 41 of the high frequency circuit board 30 to be encompassed in the signal land 21 of the board equipped with an antenna 10 in a plan view.

Figure 2B:
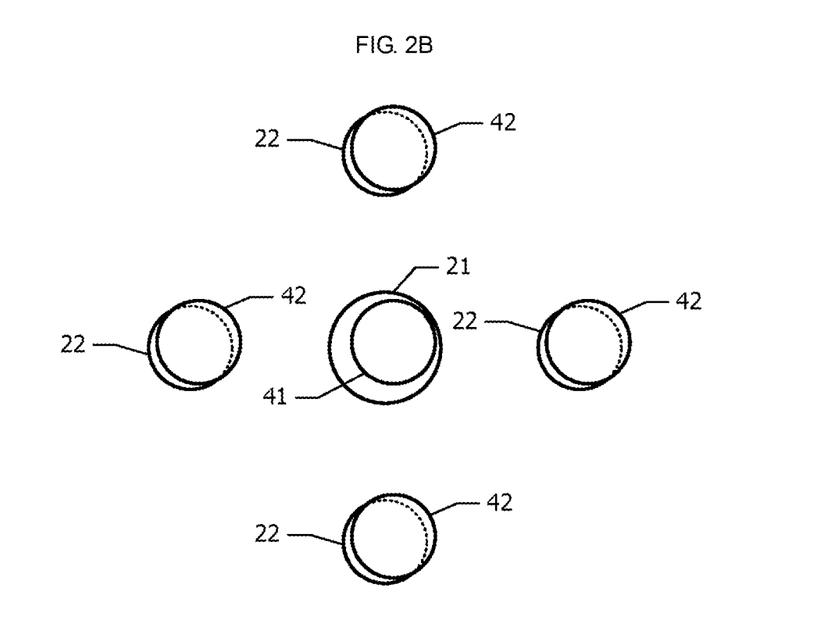

FIG. 2B illustrates a state in which the high frequency circuit board 30 is mounted as being shifted relative to the board equipped with an antenna 10. The center of the signal land 41 of the high frequency circuit board 30 is shifted relative to the center of the signal land 21 of the board equipped with an antenna 10. Note that, however, if the amount of shift falls within a tolerable range, the state in which the signal land 41 of the high frequency circuit board 30 is encompassed in the signal land 21 of the board equipped with an antenna 10 is maintained.

Effect of Second Embodiment

Next, an excellent effect of the second embodiment will be described. Even in the case where the high frequency circuit board 30 is mounted as being shifted relative to the board equipped with an antenna 10, if the amount of shift falls within the tolerable range, an area of a portion where the signal lands 21 and 41 overlap with each other is unchanged. This makes it possible to maintain capacitance between the signal lands 21 and 41 to be constant. As a result, a variation in transmission characteristics among individual high frequency modules 1 can be lessened.

Variation on Second Embodiment

Although each of FIGS. 2A and 2B describes an example in which the signal land 21 of the board equipped with an antenna 10 is larger than the signal land 41 of the high frequency circuit board 30, the signal land 41 may be larger than the signal land 21. For example, the signal land 21 of the board equipped with an antenna 10 may be formed in a substantially circular shape with a diameter of about 300 µm, while the signal land 41 of the high frequency circuit board 30 may be formed in a substantially circular shape with a diameter of about 400 µm.

Third Embodiment

Next, a high frequency module according to a third embodiment will be described with reference to FIGS. 3A, 3B, and 4. Hereinafter, description of the same configurations as those of the first and second embodiments will be omitted.

Figure 3A:
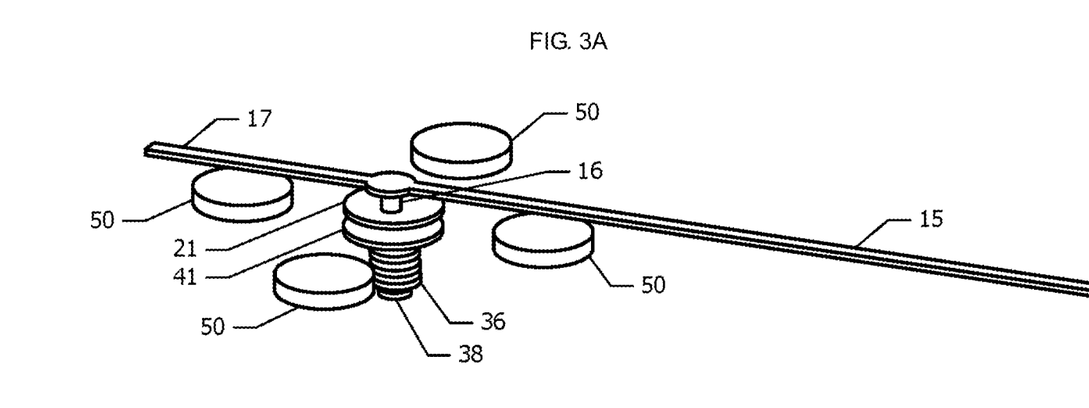
FIG. 3A and FIG. 3B are respectively a perspective view and a cross-sectional view of a high frequency signal transmission path connecting an RFIC and a radiation element of a high frequency module according to a third embodiment.
Figure 3B:
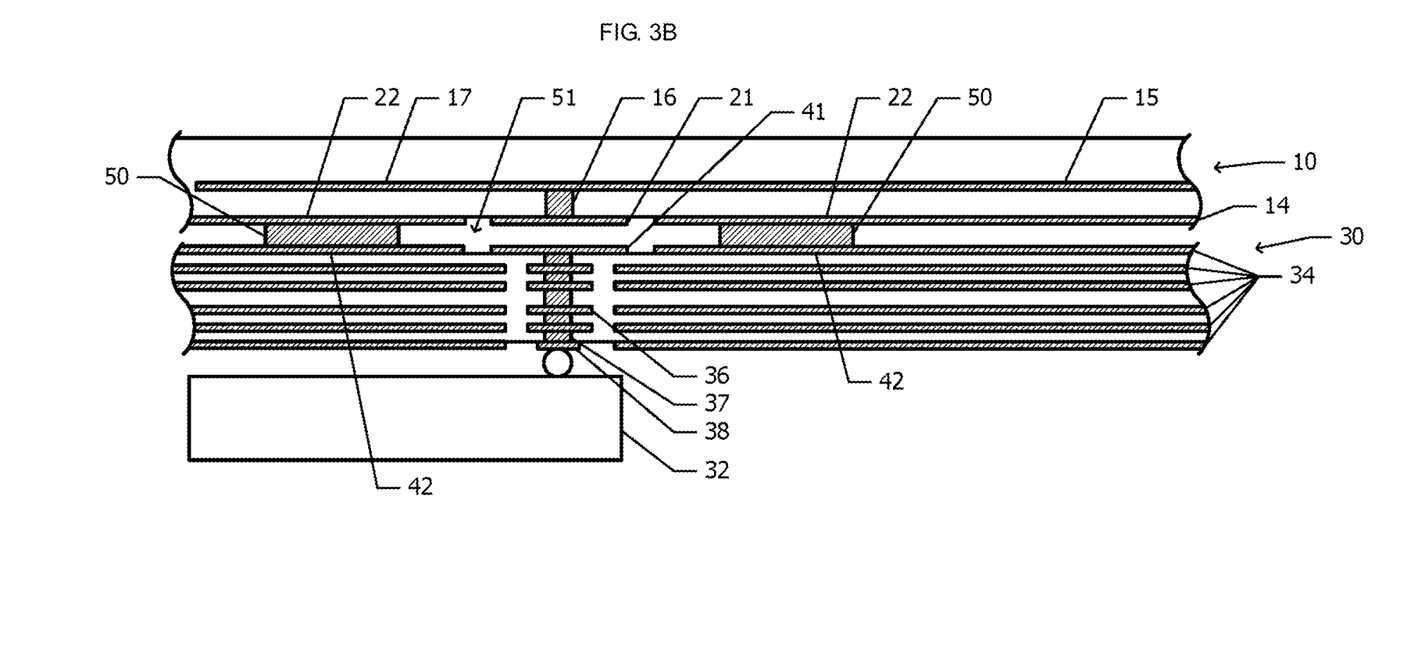

FIG. 3A and FIG. 3B are respectively a perspective view and a cross-sectional view of a high frequency signal transmission path connecting the RFIC 32 and the radiation element 13 (FIG. 1). Note that the upper side and lower side in FIG. 1 are inverted in the drawings of FIGS. 3A and 3B. That is, the high frequency circuit board 30 is illustrated on the lower side while the board equipped with an antenna 10 is illustrated on the upper side in each of the drawings. Further, the ground plane is not illustrated in FIG. 3A. The RFIC 32 is mounted on the high frequency circuit board 30 with solder bumps or the like interposed therebetween. An RFIC land 38 of the high frequency circuit board 30 is connected to a signal terminal of the RFIC with a solder bump interposed therebetween.

The high frequency circuit board 30 includes the ground planes 34 that are respectively provided on the surfaces on both sides thereof, and four layers configured of the ground planes 34 that are disposed in an inner layer thereof. The high frequency circuit board 30 further includes the signal land 41 and the ground land 42 provided on a surface on the opposite side to the surface on which the RFIC 32 is mounted. The ground land 42 is configured by a part of the ground plane 34 formed on the surface.

The signal land 41 is connected to the signal terminal of the RFIC 32 with a plurality of conductor vias 37 as well as a plurality of inner layer lands 36 disposed in the inner layer of the high frequency circuit board 30, and the RFIC land 38 interposed therebetween. The plurality of conductor vias 37 and the plurality of inner layer lands 36 function as the transmission line 35 (FIG. 1).

The board equipped with an antenna 10 includes the signal land 21 provided on a surface opposing the high frequency circuit board 30, the transmission line 15 disposed in an inner layer thereof, and the ground plane 14 provided on the surface opposing the high frequency circuit board 30. A part of the ground plane 14 is used as the ground land 22. There are also provided the ground planes 14 on both sides of the transmission line 15 so that the transmission line 15 has a coplanar waveguide structure equipped with a ground. The radiation element 13 (FIG. 1) is connected to a leading end of the transmission line 15.

The transmission line 15, at one end thereof, is connected to the signal land 21 with a conductor via 16 interposed therebetween. An open stub 17 is disposed on a connection portion between the transmission line 15 and the signal land 21. The open stub 17 is disposed, for example, in the same layer as the transmission line 15, and extends, taking the signal land 21 as a starting point, in a direction opposite to the side of the transmission line 15.

A portion serving as the ground land 42 of the ground plane 34 provided on the surface of the high frequency circuit board 30 opposing the board equipped with an antenna 10 and a portion serving as the ground land 22 of the ground plane 14 provided on the surface of the board equipped with an antenna 10 opposing the high frequency circuit board 30 are connected to each other by each of a plurality of conduction members 50, for example, by four conduction members 50. The conduction members 50 are so disposed as to surround the signal lands 21 and 41 in a plan view. An underfill material 51 is filled into between the high frequency circuit board 30 and the board equipped with an antenna 10.

Figure 4:
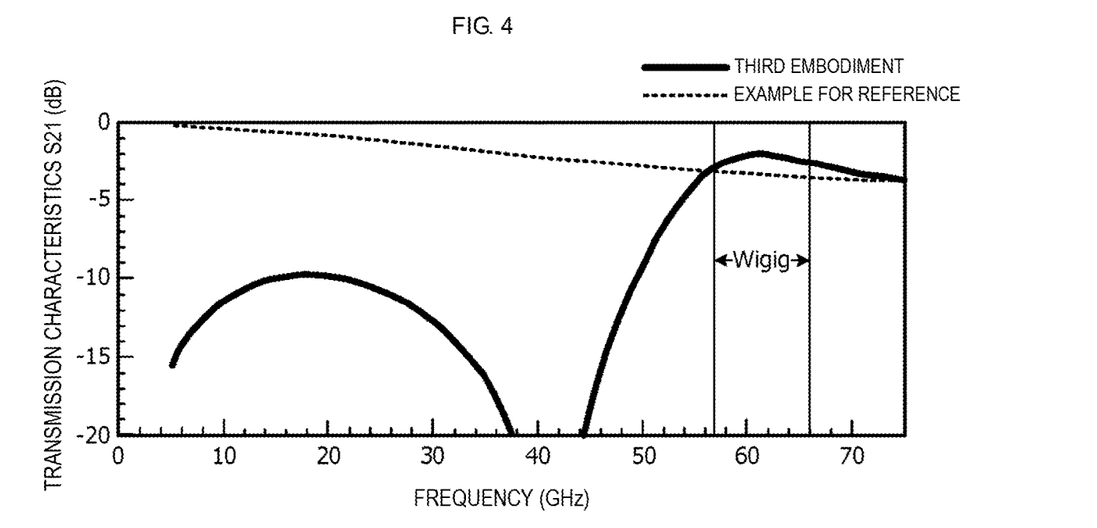
FIG. 4 is a graph indicating a simulation result of transmittance characteristics from an RFIC land to a leading end of a transmission line.

FIG. 4 is a graph indicating a simulation result of transmittance characteristics S21 from the RFIC land 38 to the leading end of the transmission line 15 (FIGS. 3A and 3B). The horizontal axis represents the frequency in units of "GHz", while the vertical axis represents the transmittance characteristics S21 in units of "dB". A solid line in FIG. 4 indicates the transmittance characteristics S21 of the high frequency module according to the third embodiment shown in FIGS. 3A and 3B, and a broken line indicates transmittance characteristics S21 of a high frequency module according to a reference example. In the high frequency module according to the reference example, the signal lands 21 and 41 are connected with a conduction member, and the open stub 17 is not provided.

Hereinafter, the configuration of the high frequency module according to the third embodiment, which was a simulation target, will be described. A desired electrostatic capacity of a capacitor configured by the signal lands 21 and 41 is about 50 fF. In order to meet this requirement, a planar shape of each of the signal lands 21 and 24 was made substantially circular having a diameter of about 300 μm, a relative dielectric constant of a space between the signal lands 21 and 41 was set to be about four, an interval between the signal lands 21 and 41 was set to be about 50 μm, impedance of the open stub was set to be about 50Ω, and an electrical length of the open stub was set to be about 0.3 times the wave length of a signal of about 60 GHz.

Effect of Third Embodiment

As shown in FIG. 4, it is understood that the high frequency module according to the third embodiment can obtain more favorable transmittance characteristics S21 than the high frequency module according to the reference example in a frequency band of no less than about 57 GHz and no more than about 66 GHz that is used in the communications of the Wigig standards. Further, the high frequency module according to the third embodiment exhibits rejection characteristics of no less than about −10 dB in a frequency region lower than about 50 GHz.

As can be understood from the simulation result shown in FIG. 4, the configuration in which the signal lands 21 and 41 are not connected with a conduction member makes it possible to improve the transmittance characteristics in the frequency band of no less than about 57 GHz and no more than about 66 GHz, and improve the rejection characteristics against low frequency noise in a frequency region lower than the above frequency band. Further, providing the open stub 17 makes it possible to obtain the impedance matching.

Fourth Embodiment

Next, a high frequency module according to a fourth embodiment will be described with reference to FIG. 5. Hereinafter, description of the same configurations as those of the first through third embodiments will be omitted.

In the high frequency module according to the fourth embodiment, a short stub is provided in place of the open stub 17 of the high frequency module according to the third embodiment (FIGS. 3A and 3B). Impedance of the short stub is about 50Ω, and an electrical length thereof is about 0.75 times the wave length of a signal of about 60 GHz. Other configurations are the same as those of the high frequency module according to the third embodiment shown in FIGS. 3A and 3B.

Figure 5:
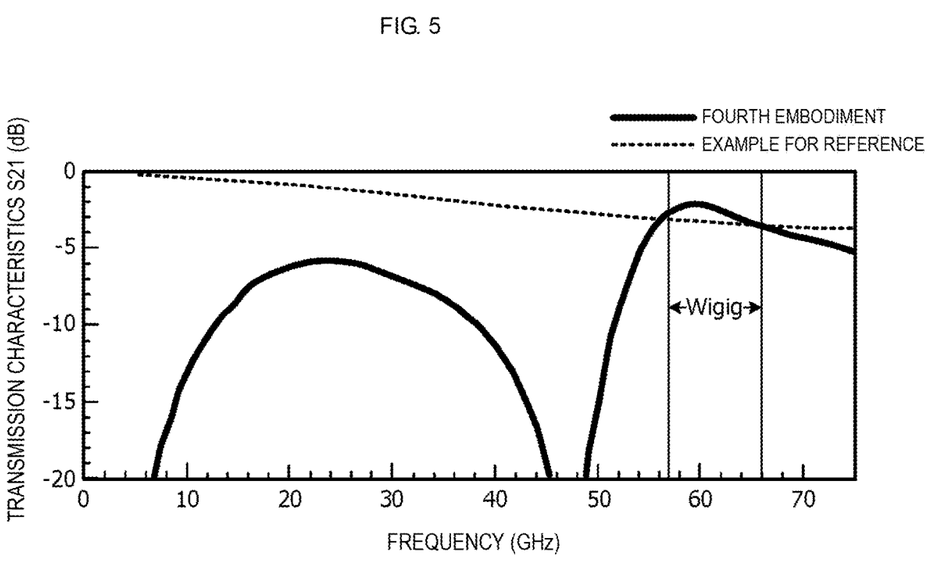
FIG. 5 is a graph indicating a simulation result of transmittance characteristics from an RFIC land to a leading end of a transmission line according to a fourth embodiment.

FIG. 5 is a graph indicating a simulation result of transmittance characteristics S21 from the RFIC land 38 to the leading end of the transmission line 15. The horizontal axis represents the frequency in units of "GHz", while the vertical axis represents the transmittance characteristics S21 in units of "dB". A solid line in FIG. 5 indicates the transmittance characteristics S21 of the high frequency module according to the fourth embodiment, and a broken line indicates transmittance characteristics S21 of a high frequency module according to a reference example. The transmittance characteristics S21 of the high frequency module according to the reference example are the same as those shown in FIG. 4.

It is understood that the high frequency module according to the fourth embodiment can also obtain more favorable transmittance characteristics S21 than the high frequency module according to the reference example in the frequency band of no less than about 57 GHz and no more than about 66 GHz that is used in the communications of the Wigig standards. Further, the high frequency module according to the fourth embodiment also exhibits more favorable rejection characteristics than the high frequency module according to the reference example in a frequency region lower than about 50 GHz.

In the fourth embodiment, because the short stub is used in place of the open stub, high electro-static discharge (ESD) resistance can be obtained.

It can be understood, by comparing FIG. 4 with FIG. 5, that the employment of the short stub rather than the open stub is preferable in the case where the leakage of low frequency noise of about 50 GHz, which is slightly lower than the Wigig standards frequency band, needs to be suppressed. It can be understood that the employment of the open stub rather than the short stub is preferable so as to obtain an effect of noise leakage suppression across the entire frequency region lower than the Wigig standards frequency band.

Fifth Embodiment

Next, a high frequency module according to a fifth embodiment will be described with reference to FIG. 6A and FIG. 6B. Hereinafter, description of the same configurations as those of the first through fourth embodiments will be omitted.

Figure 6A:
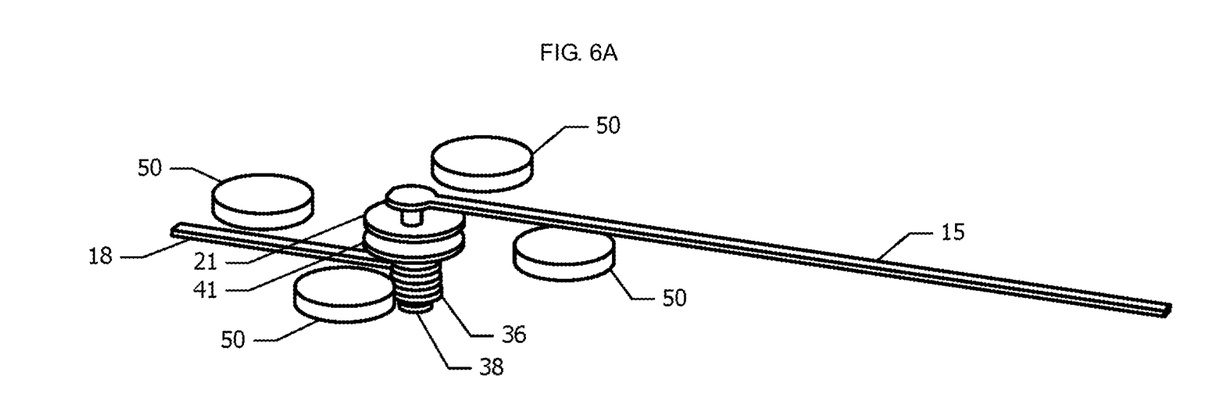
FIG. 6A and FIG. 6B are respectively a perspective view and a cross-sectional view of a high frequency signal transmission path connecting an RFIC and a radiation element of a high frequency module according to a fifth embodiment.
Figure 6B:
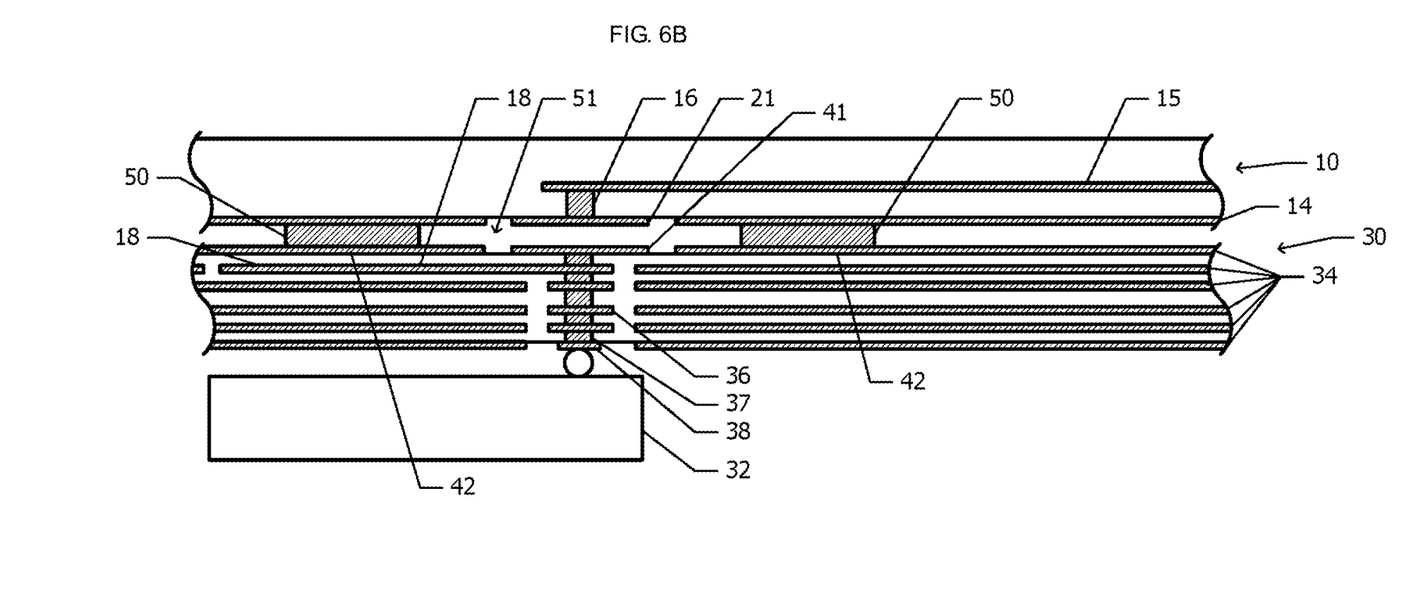

FIG. 6A and FIG. 6B are respectively a perspective view and a cross-sectional view of a high frequency signal transmission path connecting the RFIC 32 and the radiation element 13. Although, in the third embodiment, the open stub 17 is provided to the transmission line 15 inside the board equipped with an antenna 10 (FIGS. 3A and 3B), an open stub 18 is provided on a connection portion between the transmission line 35 inside the high frequency circuit board 30 (FIG. 1) and the signal land 41 in the fifth embodiment. Further, like in the fourth embodiment, a short stub instead of the open stub 18 may be provided. The same effects as those of the third or fourth embodiment can be obtained in the fifth embodiment as well.

It should be understood that the above-described embodiments are illustrative only, and that configurations described in different embodiments can partly replace each other or be combined as well. Same action effects brought by the same configurations in the plurality of embodiments are not successively described in each of the embodiments. Further, the present disclosure is not limited to the above-described embodiments. For example, it will be apparent to those skilled in the art that various kinds of changes, improvements, combinations, and so on can be carried out.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high frequency module comprising:
a first board having a first ground plane, a first ground land connected to the first ground plane, a first transmission line, and a first signal land connected to the first transmission line, wherein the first ground land and the first signal land are located on a same surface;
a second board having a second ground plane, a second ground land connected to the second ground plane, a second transmission line, and a second signal land connected to the second transmission line, wherein the second ground land and the second signal land are located on a surface opposing to the first board and are respectively opposed to the first ground land and the first signal land; and
a conduction member for connecting the first ground land to the second ground land, wherein the first signal land and the second signal land are connected by capacitance coupling without using any conductor,
wherein the first board further includes a radiation element connected to the first signal land with the first transmission line interposed between the radiation element and the first signal land, and a high frequency circuit element is mounted on the second board and is connected to the second signal land with the second transmission line interposed between the high frequency circuit element and the second signal land,
wherein areas of the first signal land and the second signal land opposing each other are different from each other, and one of the first signal land and the second signal land is encompassed in another one of the first signal land and seconds signal land in a plan view, and
wherein, when a positional shift between the first board and the second board occurs, the capacitance generated between the first signal land and the second signal land is maintained to be constant.

2. The high frequency module according to claim 1, wherein the first board includes a first stub provided on a connection portion between the first transmission line and the first signal land.

3. The high frequency module according to claim 2, wherein the second board includes a second stub provided on a connection portion between the second transmission line and the second signal land.

4. The high frequency module according to claim 2, wherein the first board includes a first protection film provided on a surface opposing to the second board, exposing the first ground land, and covering the first signal land, and
the second board includes a second protection film provided on a surface opposing to the first board, exposing the second ground land, and covering the second signal land.

5. The high frequency module according to claim 1, wherein the second board includes a second stub provided on a connection portion between the second transmission line and the second signal land.

6. The high frequency module according to claim 5, wherein the first board includes a first protection film provided on a surface opposing to the second board, exposing the first ground land, and covering the first signal land, and the second board includes a second protection film provided on a surface opposing to the first board, exposing the second ground land, and covering the second signal land.

7. The high frequency module according to claim 1, wherein the first board includes a first protection film provided on a surface opposing to the second board, exposing the first ground land, and covering the first signal land, and the second board includes a second protection film provided on a surface opposing to the first board, exposing the second ground land, and covering the second signal land.

8. The high frequency module according to claim 1, wherein the first board includes a first protection film provided on a surface opposing to the second board, exposing the first ground land, and covering the first signal land, and the second board includes a second protection film provided on a surface opposing to the first board, exposing the second ground land, and covering the second signal land.

\* \* \* \* \*